United States Patent [19]

Koakutsu et al.

[11] Patent Number: 5,148,115
[45] Date of Patent: Sep. 15, 1992

[54] LOAD CONNECTION STATE DETECTOR CIRCUIT

[75] Inventors: Hiroshi Koakutsu; Kouji Tatani, both of Gunma, Japan

[73] Assignee: Sanyo Electric Co., Ltd., Osaka, Japan

[21] Appl. No.: 687,157

[22] Filed: Apr. 18, 1991

[30] Foreign Application Priority Data

Apr. 19, 1990 [JP] Japan .................................. 2-103335
Oct. 24, 1990 [JP] Japan .................................. 2-287480

[51] Int. Cl.⁵ ............................ H03F 1/02; H03F 3/68
[52] U.S. Cl. ........................................... 330/2; 330/9; 330/295
[58] Field of Search ................... 330/2, 9, 124 R, 261, 330/295, 296, 297; 381/59, 120, 121

[56] References Cited

U.S. PATENT DOCUMENTS 3,067,297 12/1962 Fink .................................... 381/1
4,908,868 3/1990 McTaggart ........................ 381/59

Primary Examiner—James B. Mullins
Attorney, Agent, or Firm—Armstrong & Kubovcik

[57] ABSTRACT

A load connection state detector circuit for use in a stereophonic system comprises: a check mode setting circuit for generating a check mode signal to perform checking; an offset generator circuit for generating an offset voltage from an input-stage amplification section according to the check mode signal; a first current detector circuit for detecting a current flowing to a first load according to the offset voltage; a second current detector circuit for detecting a current to a second load according to the offset voltage; and a difference-current detector circuit for detecting whether or not a difference current between output currents of the first and second current detector circuits falls within a predetermined range.

8 Claims, 8 Drawing Sheets

LOAD CONNECTION STATE DETECTOR CIRCUIT

BACKGROUND OF THE INVENTION

1. Field of the Invention

The present invention relates to load-connection-state detector circuits and more particularly to a load-connection-state detector circuit that can correctly detect connection-state of loads with a simplified construction. Description of the Prior Art A stereo amplifier as shown in FIG. 1 is previously known in which a first input amplifier circuit 1 and first and second output amplifier circuits 2 and 3 make up a left-channel amplifier 4 so that a left-channel stereo signal derived from a first signal source 5 is applied from the left-channel amplifier to a left-channel speaker 6 that makes a load and in which, in contrast, a second input amplifier circuit 7 and third and fourth output amplifier circuits 8 and 9 make up a right-channel amplifier 10 so that a right-channel stereo signal derived from a second signal source 11 is applied from the right-channel amplifier 10 to a right-channel speaker 12.

In the stereo amplifier, output signals opposite in phase to each other generated by the first and second input amplifier circuits 1 and 7 are applied to the first to fourth output amplifier circuits 2 to 9, which circuits thus BTL-drive left-channel and right-channel speakers 6 and 12, respectively.

When the foregoing stereo amplifier is used as on-vehicle equipment, the left-channel and right-channel speakers 6 and 12 are embedded into a panel of a car. This prohibits visual verification of whether or not the stereo amplifiers are correctly connected with the speakers, so that it is required to listen to sounds produced by the speakers with input signals applied, by ear. In noisy places such as in factories, however, the aural check is difficult to carry out and, for more accuracy, requires a lot of time. This problem has been growing remarkably in recent days as the speakers provided in a car increases in number.

SUMMARY OF THE INVENTION

In accomplishing these and other objects, a load-connection-state detector circuit according to the present invention comprises: a check mode setting circuit for generating a check mode signal to perform checking; an offset generator circuit for generating an offset voltage from an input-stage amplification section according to the check mode signal; a first current detector circuit for detecting a current flowing to a first load according to the offset voltage; a second current detector circuit for detecting a current to a second load according to the offset voltage; and a difference-current detector circuit for detecting whether or not a difference current between output currents of the first and second current detector circuits falls within a predetermined range.

According to the present invention, when one of the left-channel and right-channel speakers is disconnected with the output end of the output-stage amplification section into an open state, the open-state side current detector circuit will no longer generate an output current, causing the value of difference current to increase. This difference current of an increased value is detected by the difference-current detector circuit, thus allowing the detection of a load-open state to be achieved.

DESCRIPTION OF THE PREFERRED EMBODIMENTS

Figure 1:
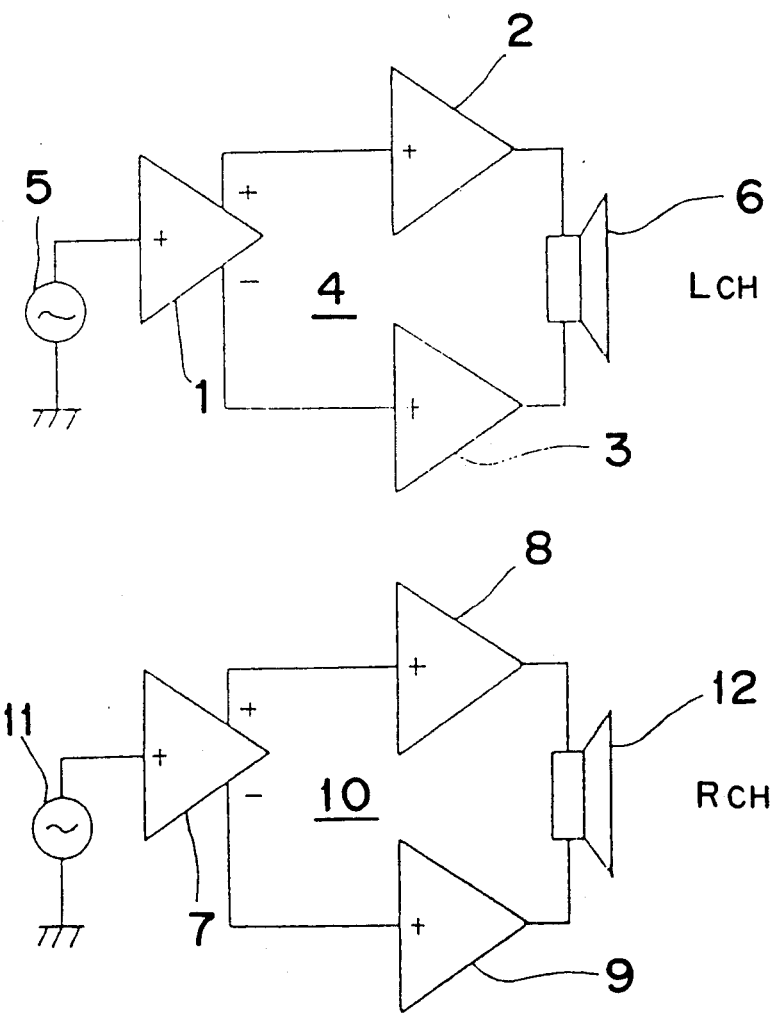
FIG. 1 is a circuit diagram showing a connection state of speakers in a conventional stereophonic system.
Figure 2:
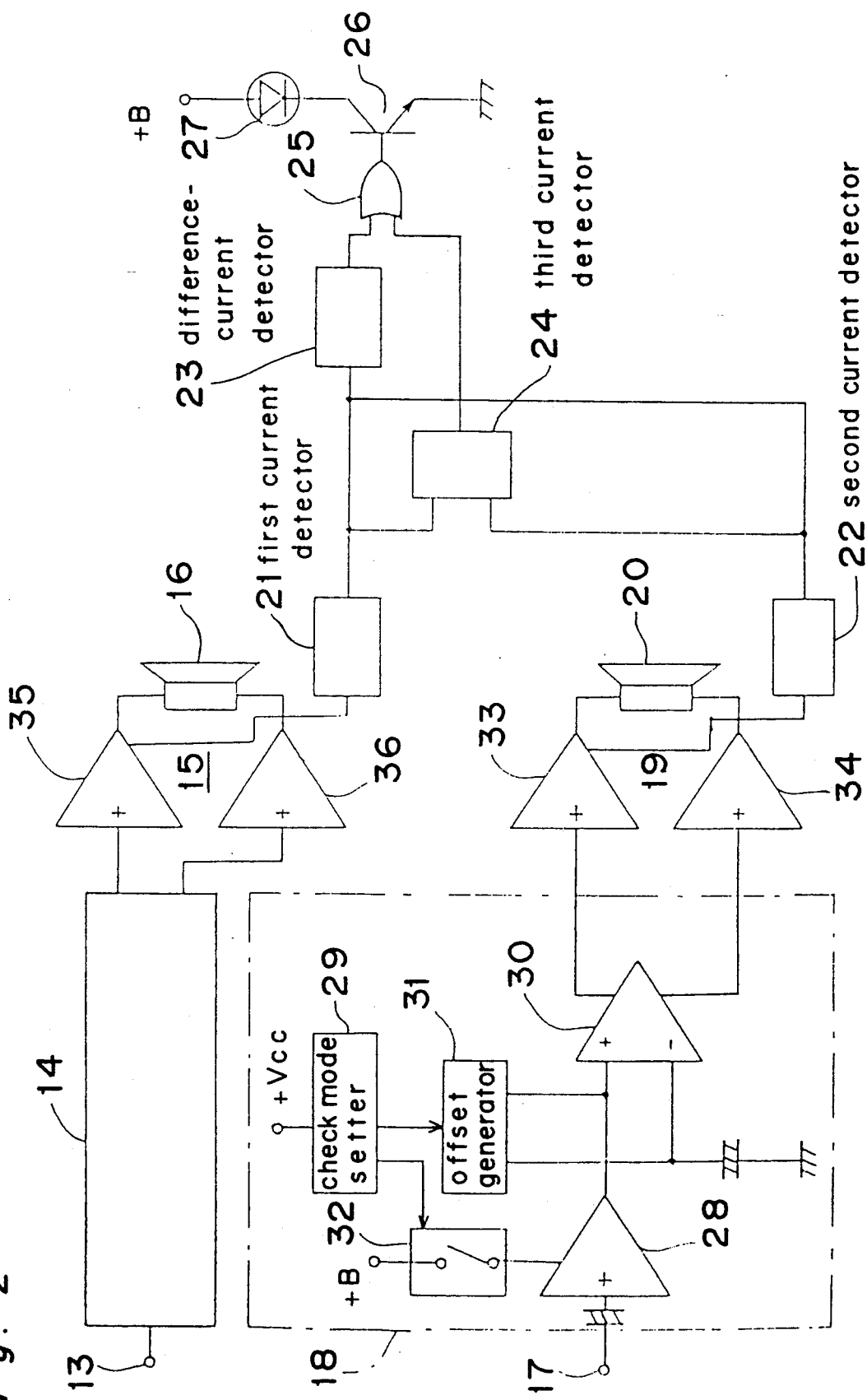
FIG. 2 is a circuit diagram showing an embodiment of a load connection state detector circuit according to the present invention.

FIG. 2 is a circuit diagram showing an embodiment of the present invention, wherein reference numerals 13 is a left-channel input terminal to which a left-channel stereo signal is applied; 14 is a first input-stage amplification section that amplifies the left-channel stereo signal; 15 is a first output-stage amplification section that amplifies output signals opposite in polarity to each other obtained from the first input-stage amplification section 14; 16 is a first speaker BTL-connected to the first output-stage amplification section 15; 17 is a right-channel input terminal to which a right-channel stereo signal is applied; 18 is a second input-stage amplification section that amplifies the right-channel stereo signal; 19 is a second output-stage amplification section that amplifies output signals opposite in polarity to each other obtained from the second input-stage amplification section 18; 20 is a second speaker BTL-connected to the second output-stage amplification section 19; 21 is a first current detector circuit that detects a current flowing to the first speaker 16; 22 is a second current detector circuit that detects a current flowing to the second speaker 20; 23 is a difference-current detector circuit that detects a difference current between the first and second current detector circuits 21 and 22 and that produces its output when the value of the difference current is over a predetermined one; 24 is a third current detector circuit that detects that at least one of the first and second current detector circuits 21 and 22 is generating an output current; 25 is an OR-gate to which the output end of the difference-current detector circuit 23 or the third current detector circuit 24 is connected; 26 is a driving transistor controlled by the output of the OR-gate 25; and 27 is a display diode driven by the driving transistor 26.

In this arrangement, the second input-stage amplification section 18 includes: a preamplifier 28 that amplifies a right-channel stereo signal applied to the right-channel input terminal 17; a check mode setting circuit 29 that generates a check mode signal for checking; an input amplifier circuit 30 that amplifies an output signal of the preamplifier circuit 28; an offset generator circuit 31 that operates according to the check mode signal and that is connected between the input terminals of the input amplifier circuit 30; and a cutoff circuit 32 that cuts off the bias for the preamplifier circuit 28 according to the check mode signal. Also, the first input-stage amplification section 14 has the same arrangement as above, detailed description of which are omitted.

In the normal listening mode, a right-channel stereo signal applied to the right-channel input terminal 17 is amplified by the preamplifier circuit 28, then applied to the input amplifier circuit 30. The input amplifier circuit 30 amplifies an input signal to generate output signals opposite in phase to each other at its two output ends. A positive output signal of the input amplifier circuit 30 is applied to a positive amplifier circuit 33, while a negative output signal is applied to a negative amplifier circuit 34 and amplified. Since the positive and negative amplifier circuits 33 and 34 forming the second output-stage amplification section 19 are BTL-connected to the second speaker 20, the second speaker 20 is BTL-driven.

Likewise, a left-channel input signal applied to the left-channel input terminal 13 is amplified by the input-stage amplification section 14 and the output-stage amplification section 15, then applied to the first speaker 16. As a result, the first and second speakers 16 and 20 produce sounds according to the left-channel and right-channel stereo signals, respectively, allowing stereophonic sound reproduction to be achieved.

Referring next to the check mode, to turn to the check mode for checking the connection state of the speakers, first the check mode setting circuit 29 is activated. Then a check mode signal is generated from the check mode setting circuit 29, activating the offset generator circuit 31 and the cutoff circuit 32 as well. Since the offset generator circuit 31 gives a predetermined offset between the input terminals of the input amplifier circuit 30, there develops the predetermined offset between the two output terminals of the input amplifier circuit 30. On the other hand, since the cutoff circuit 32 cuts off the bias for the preamplifier circuit 28, the right-channel stereo signal is no longer applied to the input amplifier circuit 30. The output offset voltage of the input amplifier circuit 30 is applied to the positive and negative amplifier circuits 33 and 34 of the output-stage amplification section 19, then amplified there and thereafter applied to the second speaker 20. As a result, the second speaker 20 has a current flowing therethrough according to the difference voltage of output voltages of the positive and negative amplifier circuits 33 and 34.

The operations of the first input-stage amplification section 14, first output-stage amplification section 15, and first speaker 16 in the check mode are performed in all the same way as above, an offset voltage is generated from the first input-stage amplification section 14 and the first speaker 16 has a current flowing therethrough according to the output difference-voltage of the positive and negative amplifier circuits 35 and 36 of the first output-stage amplification section 15.

The first and second current detector circuits 21 and 22 detect currents flowing to the first and second speakers 16 and 20, supplying them to the difference-current detector circuit 23. The difference-current detector circuit 23 then detects whether or not the value of the difference current between output currents of the first and second current detector circuits 21 and 22 is over a predetermined value, generating an output signal. When the first and second speakers 16 and 20 are correctly connected to the first and second output-stage amplification sections 15 and 19, respectively, output currents of the first and second current detector circuits 21 and 22 are approximately equal in value, the difference current therebetween being approximately zero. As a result of this, at the output of the difference-current detector circuit 23, there is generated an output signal (e.g. "L") showing that the speakers are in a correct connection state. The signal "L" turns off the driving transistor 26 through the OR-gate 25, not causing the diode 27 to go on. When one of the first and second speakers 16 and 20 is put into the open state, output current of one of the first and second current detector circuits 21 and 22 becomes zero (an idling current is disregarded), causing the difference current thereof to be increased. This increased difference current is detected by the difference-current detector circuit 23, so that a signal showing the open state of the speaker (e.g. "H") generated by the difference-current detector circuit 23 is applied to the driving transistor 26 through the OR-gate 25. This causes the diode 27 to go on, displaying the load open state.

Accordingly, if the difference-current detector circuit 23 is used, it can be displayed that the speakers are correctly connected and that one of the first and second speakers is in the open state, with an indication which speaker matters.

As another case, when both the first and second speakers 16 and 20 are in the open state, both output currents of the first and second current detector circuits 21 and 22 become zero, causing the difference current to be zero, with the results that the diode 27 will not go on and that the same display as in the normal connection state will be made. To prevent such misdisplay from occurring, the third current detector circuit 24 in FIG. 2 is provided. More specifically, when the first and second speakers 16 and 20 are both in the open state and output currents of the first and second current detector circuits 21 and 22 become zero, there is generated an output signal "H" from the third current detector circuit 24, causing the driving transistor 26 to turn on according thereto, and the diode 27 to go on. Hence, even when both the first and second speakers 16 and 20 are in the open state, display can be made to show any abnormality.

Figure 3:
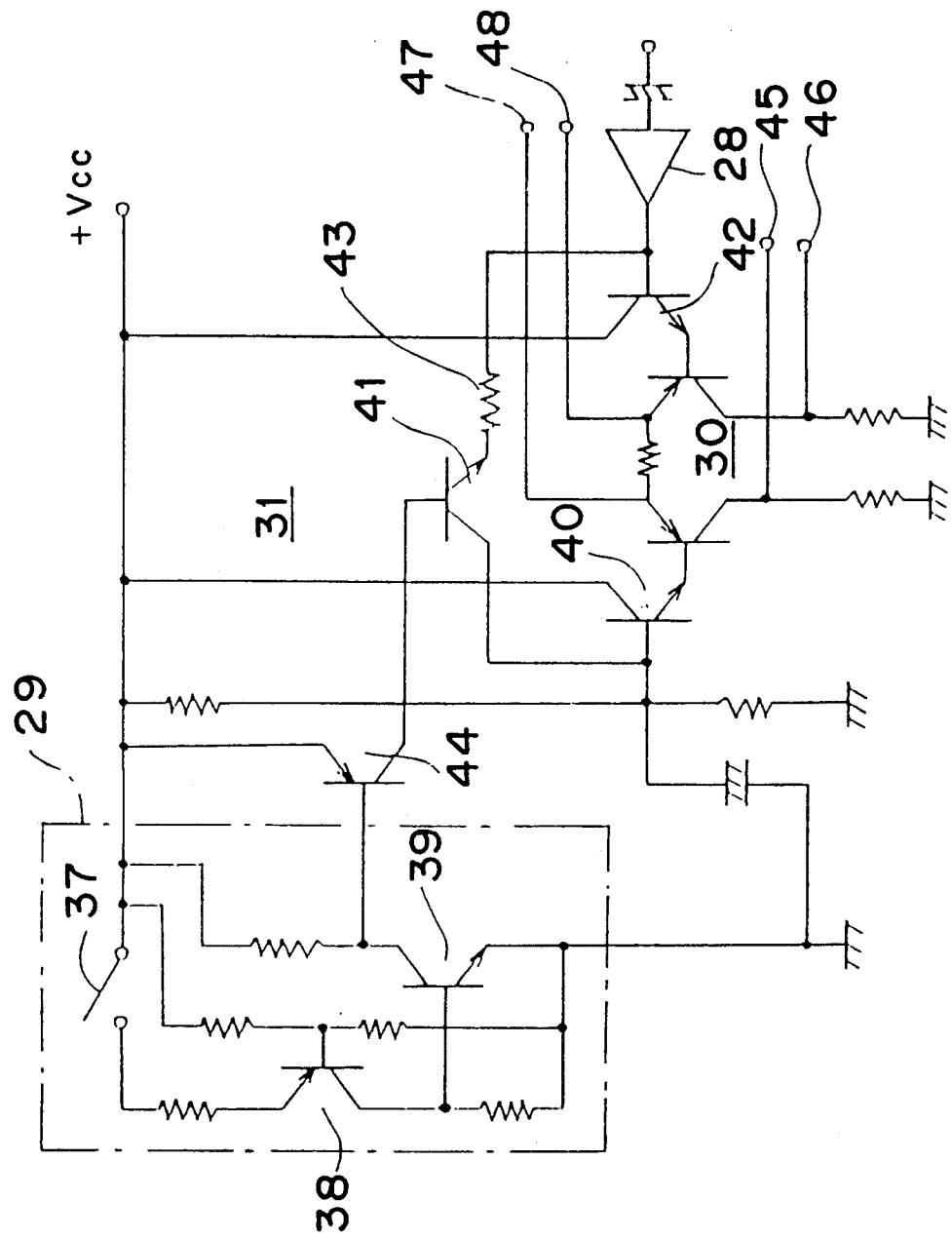
FIG. 3 is a circuit diagram showing examples of the check mode setting circuit and the offset generator circuit in FIG. 2

FIG. 3 gives examples of the check mode setting circuit 29 and the offset generator circuit 31 shown in FIG. 2. In FIG. 3, the check mode setting circuit 29 comprises a manual switch 37 and transistors 38 and 39, which transistors turn on when the former is turned on, while the offset generator circuit 31 comprises: a transistor 41, to the collector of which the base of a transistor 40 forming a part of an input-stage amplification section 30 is connected; a resistor 43 connected between the emitter thereof and the base of a transistor 42 forming a part of the input-stage amplification section 30; and a transistor 44 that drives the transistor 41 of the offset generator circuit 31 according to an output signal of the check mode setting circuit 29.

In the normal listening mode, the switch 37 is off and the transistors 38 and 39 are off, as well. Due to this, the transistors 41 and 44 of the offset generator circuit 31 are also off, causing the bases of the transistors 40 and 42 forming the input-stage amplification section 30 to be biased to an equal value. Therefore, an audio signal put out from the preamplifier circuit 28 is amplified through the input-stage amplification section 30 and transmitted to the succeeding output-stage amplification section from the output terminals 45 and 46.

To perform check, the switch 37 is turned on. Then the transistors 38 and 39 of the check mode setting circuit 29 turn on to generate a check mode signal into the check mode state. The check mode signal causes the transistors 41 and 44 of the offset generator circuit 31 to turn on, causing a predetermined offset voltage $V_{OFS}$ to be generated between the bases of the transistors 40 and 42 of the input-stage amplification section 30. The offset voltage $V_{OFS}$ becomes equal to the sum voltage of a voltage $V_{CE}$ between collector and emitter of the transistor and a voltage drop $V_R$ of the resistor 43. As the offset voltage $V_{OFS}$ is developed, there develops a predetermined offset voltage between the output terminals 45 and 46 according thereto, and applied to the output amplification section. Incidentally, the terminals 47 and 48 in FIG. 3 are those to which are applied negative feedback signals from the output-stage amplification section to the input-stage amplification section 30.

Figure 4:
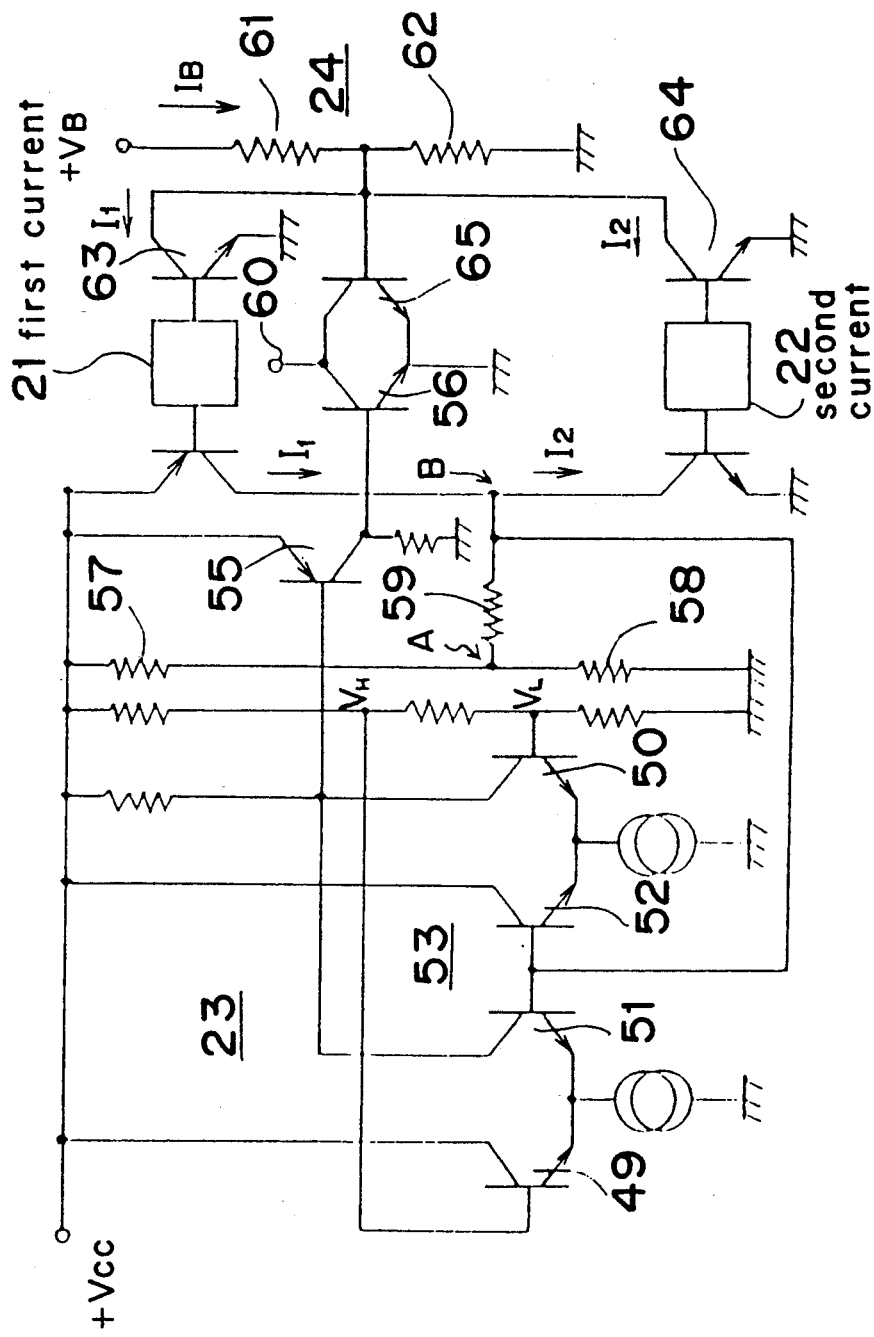
FIG. 4 is a circuit diagram showing examples of the difference-current detector circuit and the third detector circuit in FIG. 2.

FIG. 4 gives examples of the difference-current detector circuit 23 and the third current detector circuit 24. In the figure, the difference-current detector circuit 23 comprises: a comparison section 53 consisting of a first transistor 49 to the base of which a high reference voltage $V_H$ is applied, a second transistor 50 to the base of which a low reference voltage $V_L$ is applied, a third and a fourth transistors 51 and 52 to the bases of which a difference voltage is applied; a difference-voltage generation section 54 that generates the difference-voltage according to a difference current between output currents of the first and second current detector circuits 21 and 22; and driving transistors 55 and 56 that drive the display diode 27 according to an output of the comparison section 53. Now if the values of resistors 57 and 58 are set to an equal one, the voltage at point A becomes $\frac{1}{2} V_{CC}$ and the high reference voltage $V_H$ and low reference voltage $V_L$ are set such that $V_H > \frac{1}{2} V_{CC}$ and $V_L \frac{1}{2} V_{CC}$. Then if the output currents $I_1$ and $I_2$ of the first and second current generator circuits 21 and 22 are equal in value to each other, the resulting difference current becomes zero, and the voltage at point B approximately $\frac{1}{2} V_{CC}$. This causes the first and fourth transistors 49 and 52 of the comparator circuit 53 to turn on, and the driving transistors 55 and 56 to turn off. After this, when the output current $I_1$ becomes 0, the voltage at point B drops lower than that at point A by an amount of voltage drop $V_{AB}$ of the resistor 59 according to the output current $I_2$, resulting in $\frac{1}{2} V_{CC} - V_{AB}$. Therefore, if the value of the resistor 59 is previously set so that the foregoing voltage at point B will be lower than $V_L$, the first and second transistors 49 and 50 of the comparison section 53 turn on, while the third and fourth transistors 51 and 52 thereof turn off and the driving transistors 55 and 56 also turn on. As a result, there develops an output signal to the output terminal 60 connected to the display diode 27. When the output current $I_2$ becomes 0, the voltage at the point B increases in response to the output current $I_2$, by the voltage drop $V_{BA}$ of the resistor 59 than the voltage at the point A and reaches $\frac{1}{2} V_{CC} + V_{BA}$. Accordingly, upon so setting the value of the resistor 59 that the voltage at the point B is higher than $V_H$, the first and second transistors 49 and 50 of the comparator circuit 53 are turned off, causing the transistors 51 and 52, the driving transistors 55 and 56 to be turned on. As a result, there develops an output signal to the output terminal 60 connected to the display diode 27.

Referring now to the third current detector circuit 24 in FIG. 4, the circuit 24 comprises: resistors 61 and 62 for making flow of a predetermined current $I_B$; a transistor 63 for sucking therein the current $I_1$ according to an output current of the first current generator circuit 21; a transistor 64 for sucking therein the current $I_2$ according to an output current of the second current generator circuit 22; and a driving transistor 65 that operates depending on the relation between the currents $I_B$, $I_1$, and $I_2$, wherein the values of the currents are set so that $I_B < B\ I_1, I_2$. Then if no output current is generated from the first and second current generator circuits 21 and 22, the transistors 63 and 64 turn off, and the driving transistor 65 turns on according to the current $I_B$. This causes an output signal to develop at output terminal 60. On the other hand, if an output current is generated from at least one of the first and second current generator circuits 21 and 22 and one of the transistors 63 and 64 turn on, the current $I_B$ is sucked in, causing the driving transistor 65 to turn off. This causes no output signal to develop at the output terminal 60.

In consequence, with the use of the circuits shown in FIG. 4, when an output current is generated from one of the first and second current generator circuits 21 and 22, the difference-current detector circuit 23 is activated, allowing an output signal to be generated at the output terminal 60; when no output current is generated from either of the first or second current generator circuits 21 or 22, the third current detector circuit 24 is activated, allowing an output signal to be generated at the output terminal 60; and when output currents are generated from both the first and second current generator circuits 21 and 22, the difference-current detector circuit 23 and the third current generator circuit 24 are made inactive, inhibiting output signals from being generated at the output terminal 60.

Figure 5:
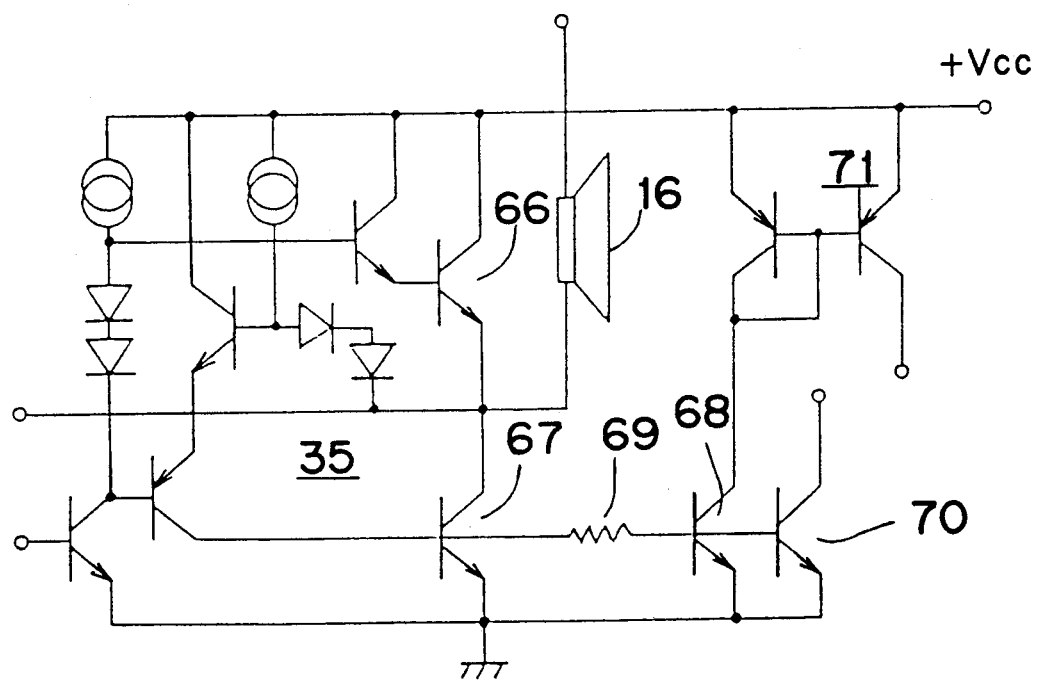
FIG. 5 is a circuit diagram showing an exemplary circuit of the first current detector circuit in FIG. 2.

FIG. 5 shows an example of the first current detector circuit 21 in FIG. 2, wherein reference numerals are as follows: 66 and 67 are first and second power transistors that form the positive amplifier 35 of the first output-stage amplification section 14; 68 is a first detector transistor the base of which is connected to the base of the second power transistor 67 via a resistor 69; 70 is a second detector transistor 70 which is common-base connected to the first detector transistor 68; and 71 is a current mirror circuit that inverts a collector current of the first detector transistor 68.

When the speaker 16 is properly connected to the common output end of the first and second power transistors 66 and 67, the collector of the second power transistor 67 has a predetermined current flowing therethrough according to the offset voltage, while the collectors of the first and second detector transistors 68 and 70 common-base connected to the second power transistor 67 also have the predetermined current or a current proportional thereto flowing therethrough. As a result, the output current of the current mirror circuit 71 becomes an outgoing current $I_1$ in 4, while the collector current of the second detector transistor 70 becomes an incoming current $I_1$.

Although the second current detector circuit 22 has approximately the same arrangement as in the first current detector circuit in FIG. 5, the polarity of current supplied to the difference-current detector circuit 23 reversed. Thus, the output current of the current mirror circuit 71 of the first current detector circuit 21 needs to be further inverted with another current mirror circuit.

As described above, according to the present invention, there can be provided a load-connection-state detector circuit capable of correctly detecting the connection state between amplifiers and loads. Since the check mode is set with a check mode setting circuit so as to activate an offset generator circuit for detection, there can be provided a load-connection-state detector circuit that will operate without being affected by ac input signals. Moreover, if a difference-current detector circuit and a third detector circuit are used in combination to perform detection, the load connection state can be detected even when right and left loads are both in the open state, enhancing the detection accuracy.

A further example of the first input stage amplification section will be explained hereinafter.

Figure 6:
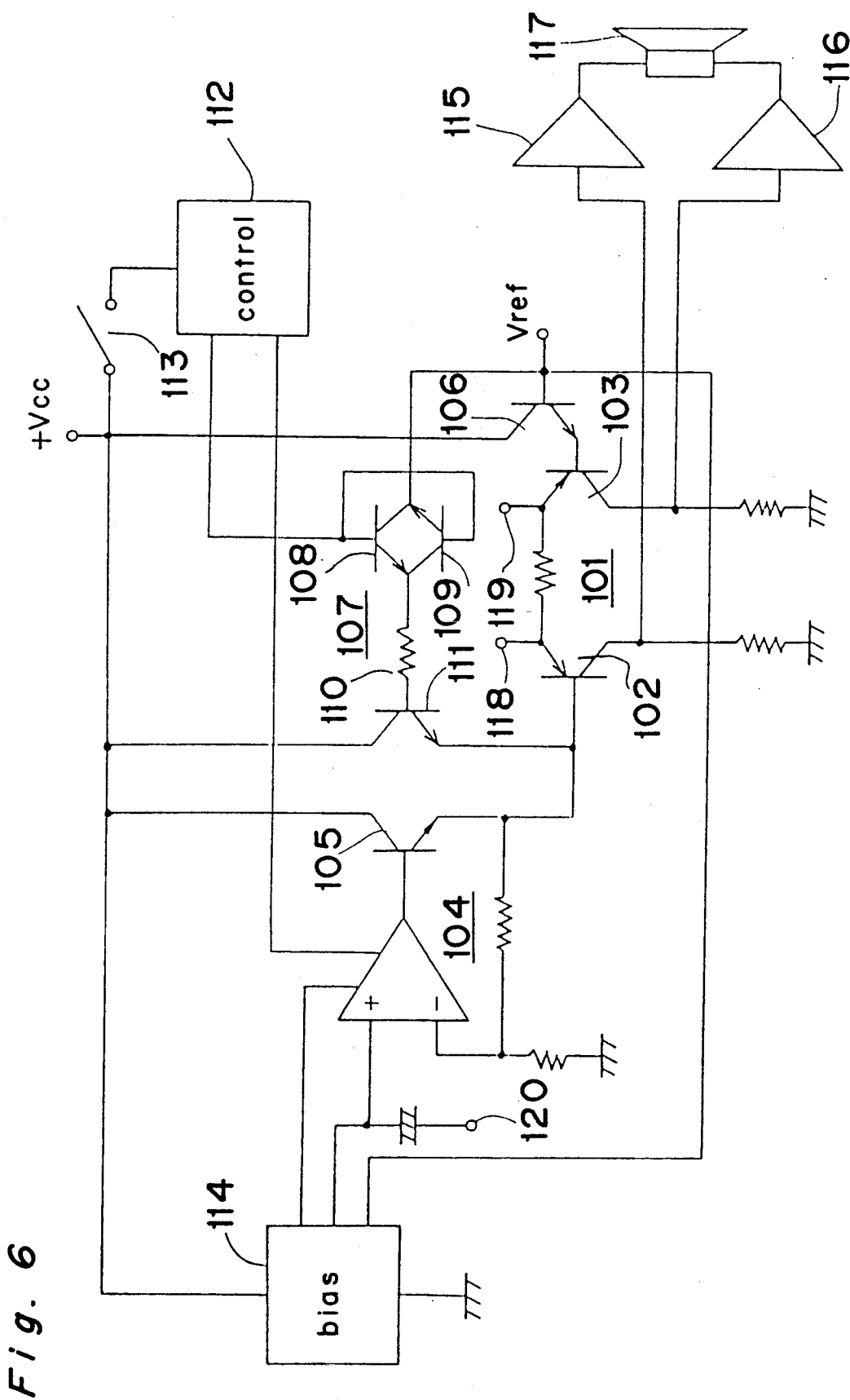
FIG. 6 is a circuit diagram showing one embodiment of the first input stage amplification section.

Referring to FIG. 6, there is shown a further embodiment of the present invention, wherein the numeral 101 indicates an amplifier circuit which includes a first transistor 102 and a second transistor 103, and the numeral 104, is an input circuit which applies an input signal to the base of the first transistor 102 through an output transistor 105. The numeral 106 shows a bias transistor for applying a reference voltage to the base of the second transistor 103, and 107 is an offset voltage generation section composed of a first offset transistor 108 and a second offset transistor 109, whose respective collectors and emitters are connected in the opposite direction with respect to each other, an offset resistor 110, and an offset input transistor 111. The numeral 112 depicts a control circuit for generating a control signal to perform on/off control of the input circuit 104 and the offset voltage generation section 107 in the opposite direction with respect to each other, and 113 is a switch for changing over the control circuit 112, and 114 shows a bias circuit which feeds a bias voltage to the input circuit 104 and a reference voltage to the amplifier circuit 1. The numerals 115 and 116 indicate power amplifier circuits which amplify the output signal fed from the amplifier circuit 101, and 117 is a speaker which is BTL connected between the output terminals of the power amplifier circuits 15 and 16. Terminals 118 and 119 are negative feedback terminals for the amplifying circuit 101.

When the amplifying circuit 101 is used for the amplification of the input signal, the switch 113 is opened as shown and the control circuit 112 is made into a first state. The control circuit 112 produces an "L" control signal at the first output terminal and an "H" control signal at the second output terminal respectively. The "L" control signal developed at the first output terminal is applied to the bases of the first transistor 108 and the second transistor 109 in the offset voltage generation section 107 to make them nonconductive, and therefore, the offset voltage generation section 107 is made inoperative. The "H" control signal developed at the second output terminal is applied to the input circuit 104 to make it operative. Thus, the input signal fed from the input terminal 120 is amplified in the input circuit 104 and again in the amplifier circuit 101 and then applied therefrom to the power amplifier circuits 115 and 116. The speaker 117 is finally BTL driven by the power amplifier circuits 115 and 116 to make a sound in response to the input signal.

Turning now to the case where the amplifier circuit 101 is used for producing an offset voltage. When this voltage is generated, the switch 113 is closed as reversed from what is shown and the control circuit 112 is made into a second state. The control circuit 112 then produces an "H" control signal at the first output terminal and an "L" control signal at the second output terminal respectively. The "L" control signal developed at the second output terminal is applied to the input circuit 104 to make it inoperative, and therefore, the output signal thereof is not applied to the amplifier circuit 101. The "H" control signal developed at the first output terminal make the first transistor 108 and the second transistor 109 in the offset voltage generation section 107 conductive. When they are turned on, a specified offset voltage $V_{OFS}$ is generated between the bases of the offset transistor 111 and the bias transistor 106. The offset voltage $V_{OFS}$ will be equal to the sum of the collector-emitter voltage $V_{CE}$ of the first and second offset transistors 108, 109 and the voltage drop $V_R$ across the offset resistor 110. The offset voltage $V_{OFS}$ is applied to the bases of the first and second transistors 102, 103 to cause the collector current of the first transistor 102 to increase and the collector current of the second transistor 103 to decrease. Therefore, the signal fed from the amplifier circuit 101 to the power amplifier circuit 115 becomes larger and the signal fed from the amplifier circuit 101. to the power amplifier circuit 116 becomes smaller, in response to which current corresponding to the difference between those signals generated from the power amplifier circuits 115, 116 will flow. Thus, it is possible to judge whether the load is correctly connected or not by detecting the current flowing in the speaker 117.

Figure 7:
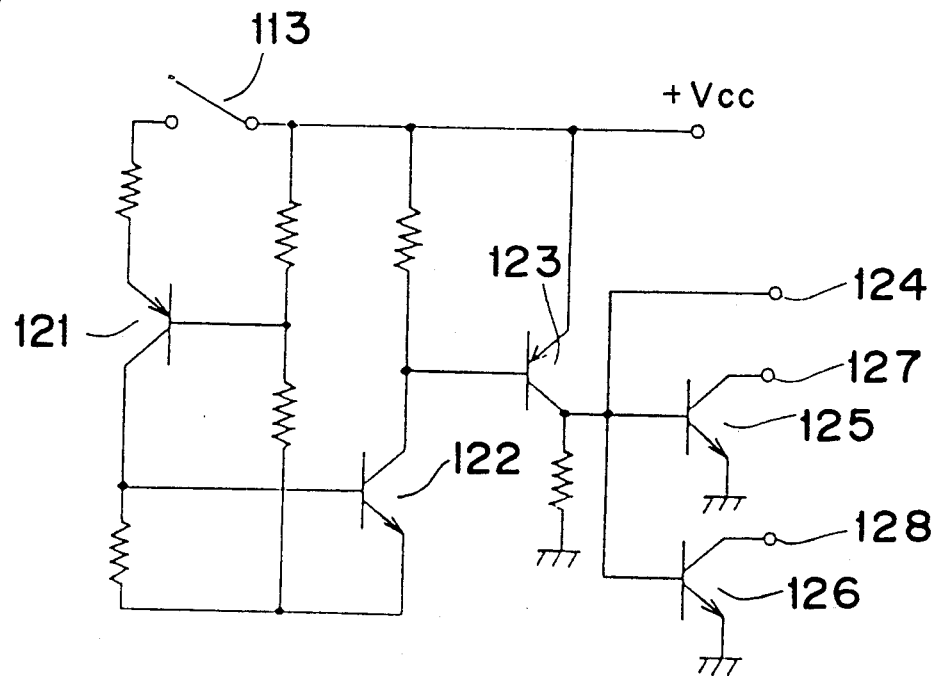
FIG. 7 is a circuit diagram showing an exemplary circuit to embody the control circuit of FIG. 6.

FIG. 7 is an exemplary circuit to embody the control circuit in FIG. 6. Referring to FIG. 7, when the switch 113 is open, transistors 121, 122 and 123 are turned off and an "L" output signal is generated at a first output terminal 124. As transistors 125 and 126 are also turned off, an "H" output signal is generated at a second and a third output terminals 127 and 128. The "L" output signal developed at the first output terminal 124 makes the offset voltage generation section 107 inoperative and the "H" output signal developed at the second and third output terminal 127 and 128 makes the input circuit 104 operative. When the switch 113 is closed, the transistors 121, 122 and 123 are turned on and an "H" output signal is generated at the first output terminal 124. As the transistors 125 and 126 are also turned on, an "L" output signal is generated at the second and the third output terminals 127 and 128. The "H" output signal developed at the first output terminal 24 makes the offset voltage generation section 107 operative and the "L" output signal developed at the second and third output terminal 127 and 128 makes the input circuit 104 inoperative.

Figure 8:
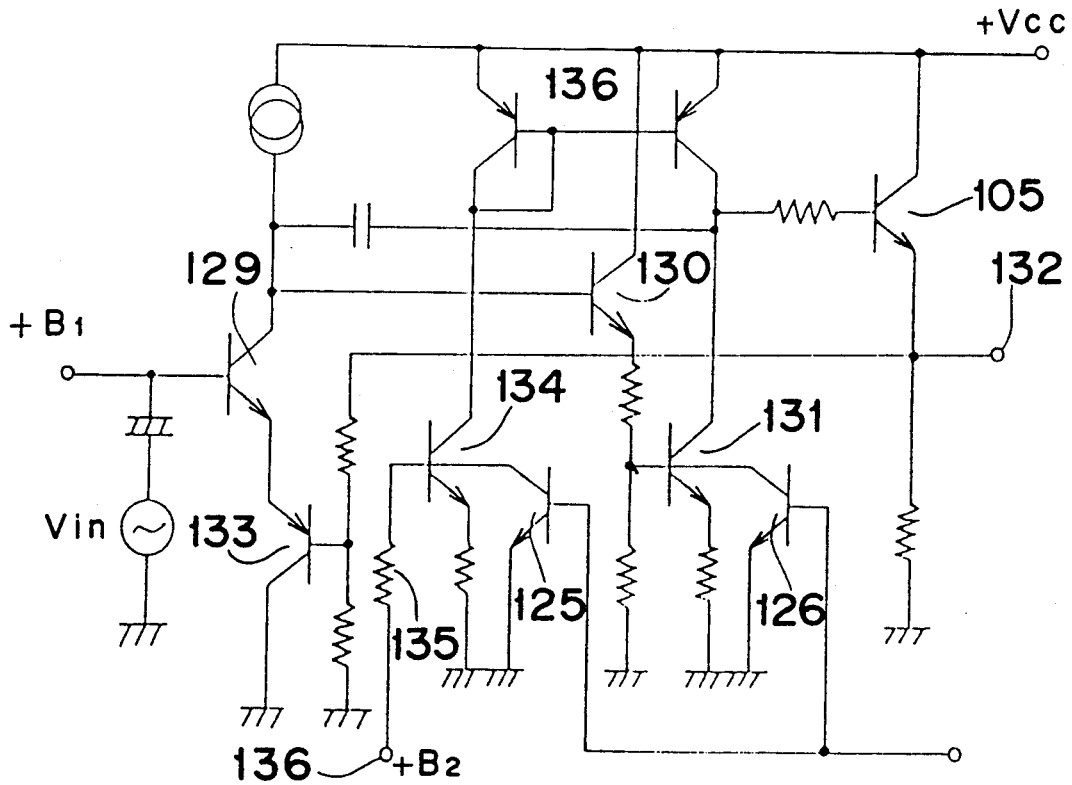
FIG. 8 is a circuit diagram showing an exemplary circuit to embody the input circuit of FIG. 6.

FIG. 8 shows an exemplary circuit to embody the input circuit 104 in FIG. 6. Referring to FIG. 8, to the base of an input transistor 129 is applied an input signal $V_{in}$ and a bias voltage $+B_1$. The input signal $V_{in}$ is amplified in an input transistor 129 and transistors 130, 131 and derived at an output terminal 132. In FIG. 8, the numeral 133 indicates a feedback transistor for feedbacking the output signal developed at the output terminal 132 to the emitter of the input transistor 129, and 134 depicts a bias transistor to which a bias voltage $+B_2$ is applied through a base resistor 135, and 136 is a current mirror circuit to invert the collector current of the bias transistor 134.

To control the operation of the input circuit 104, the collectors of the first and second output transistors 125, 126 are respectively connected to the bases of the bias transistor 134 and the transistor 131. When the first and second transistors 125, 126 are turned off, the input circuit 104 becomes operative without being influenced by the control circuit 112. When they are turned on, the bias transistor 134 and the transistor 131 become nonconductive. With the bias transistor 134 not conducting, the current mirror circuit 136 is also turned off and the current flow to the output transistor 105 is cutoff to make the input circuit 104 inoperative. At the same time, the signal transmission path is interrupted because of the transistor 131 being turned off.

As mentioned above, since the emitter of the feedback transistor 133 is connected to the input transistor 129, and the bias voltages $+B_1$ and $+B_2$ are fed from the same bias circuit 114 as hereinafter described, if the bias circuit is directly turned on and off by the first output transistor 125, the bias voltage $+B_1$ is also made on and off and the influence of which will appear at the output terminal 132 by way of the input transistor 129 and the feed back transistor 133. This influence will be amplified in the later stages at the amplifier circuit 101 and the power amplifier circuits 115, 116 to cause the speaker 117 to produce an on/of shock noise. To prevent this from occurring, the present invention provides the resistor 135 inserted between a bias voltage terminal 136 and the base of the bias transistor 134 to make the whole bias circuit not being turned off even when the first transistor 125 is turned on and the bias transistor 134 is turned off.

Figure 9:
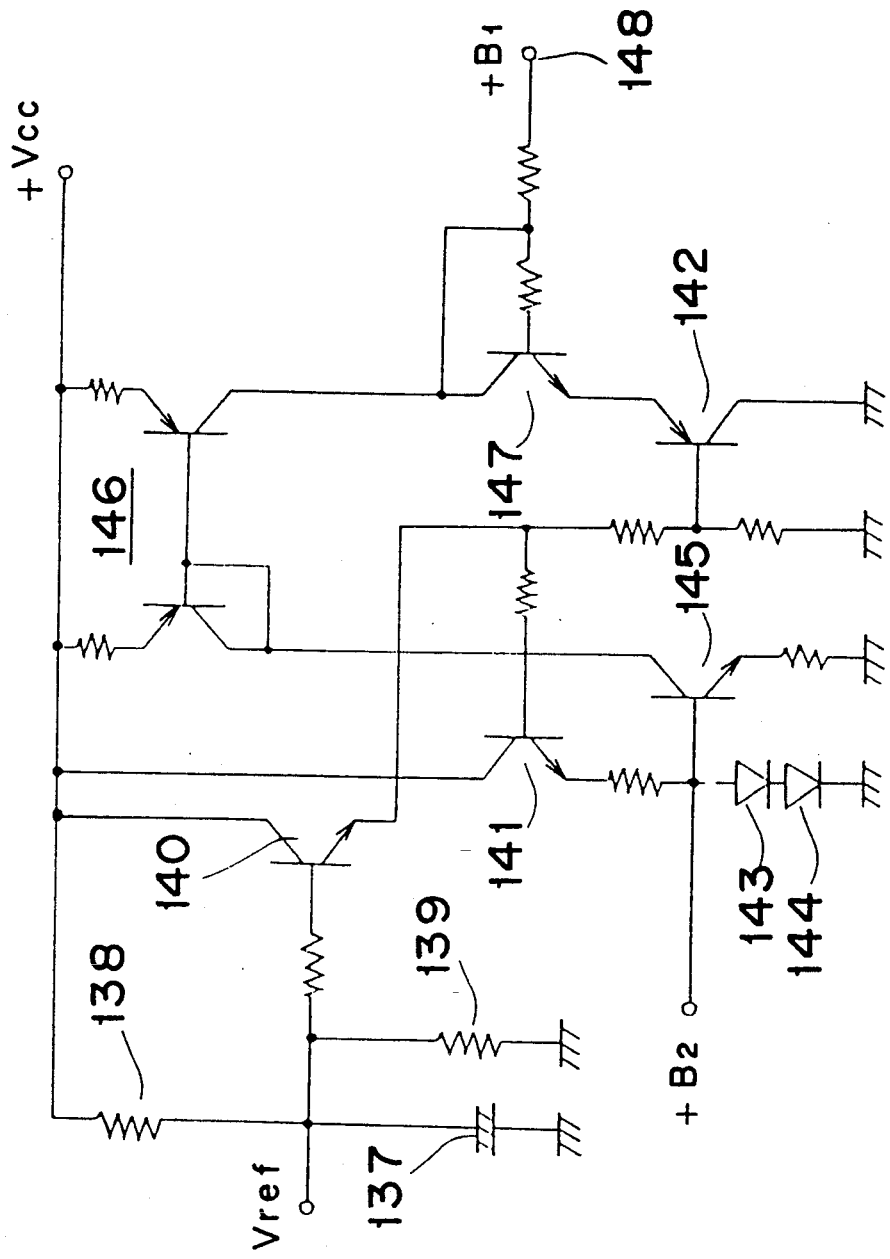
FIG. 9 is a circuit diagram showing an exemplary circuit to embody the bias circuit of FIG. 6.

FIG. 9 shows an exemplary circuit to embody the bias circuit 114 in FIG. 6. Referring to FIG. 9, when a voltage source ($+V_{CC}$) is switched on, a capacitor 137 begins to charge. When the terminal voltage of the capacitor 137 reaches a specified level which is determined according to the values of resistors 138 and 139, a transistor 40 conducts, making transistors 141 and 142 turned on. When the transistor 141 is on, current flows in diodes 143 and 144, making a transistor 145 conductive. The collector current of the transistor 145 is then inverted in a current mirror circuit 146 and fed to the collector and base of the transistor 147. At the same time, the emitter of the transistor 142 is connected to the emitter of the transistor 147 to stabilize the emitter current thereof.

The terminal voltage of the capacitor 137 is fed to the base of the bias transistor 106 in FIG. 6 as a reference voltage $V_{ref}$. The bias voltage $+B_1$ developed at the output terminal 48 is applied to the base of the input transistor 129. The bias voltage $+B_2$ determined by the diodes 143 and 144 is applied to the base of the bias transistor 134 in FIG. 8 through the resistor 135. Using a bias circuit arranged as shown in FIG. 9 with the resistor 135 disposed as described, no switching noise is produced through the control of the input circuit 104 by the control circuit 112, and the amplifier circuit 101 can be utilized for generating an offset voltage.

As mentioned above, according to the embodiment mentioned as above, since an offset voltage can be produced utilizing an amplifier circuit for the amplification of an input signal, the circuit involved can be simplified and fabrication with ICs is facilitated. Also, an offset voltage generator circuit which is capable of suppressing a switching noise when the amplifier circuit is changed over can be provided.

What is claimed is:

1. A load connection state detector circuit having first and second amplifiers arranged to amplify left- and right-channel stereo signals, respectively, for detecting whether or not loads are correctly connected to the output terminals of the first and second amplifiers, the load-connection-state detector circuit comprising:

an input-stage amplification section and an output-stage amplification section that form the first and second amplifiers, respectively;

an offset generator circuit for generating an offset voltage from said input-stage amplification section according to a check mode signal;

a first current detector circuit for detecting a current supplied from said first amplifier to load according to said offset voltage;

a second current detector circuit for detecting a current supplied from said second amplifier to load according to said offset voltage; and a difference-current detector circuit for detecting whether or not a difference current between output currents of said first and second current detector circuits falls within a predetermined range, wherein the load-connection-state detector circuit is adapted to generate an output signal showing that load is not connected correctly, when said difference current is over a predetermined value.

2. A load connection state detector circuit as claimed in claim 1, further comprising a check mode setting circuit for generating an inhibit signal to make inactive a preamplifier section disposed at the input end of said input-stage amplification section.

3. A load connection state detector circuit as claimed in claim 1, further comprising: a third current detector circuit for detecting that an output current is being generated from at least one of said first and second current detector circuits; and OR-gate for generating an output signal showing that load is not connected correctly, according to an output signal of said difference-current detector circuit or said third current detector circuit.

4. A load connection state detector circuit as claimed in claim 1, wherein said difference-current detector circuit comprises: a conversion section for converting said difference current into a voltage; a first comparison section for comparing an output voltage $V_X$ of said conversion section with a first reference voltage $V_1$; a second comparison section for comparing said output voltage $V_X$ with a second reference voltage $V_2$ lower than said first reference voltage $V_1$, and wherein when $V_x < V_1$ or $V_X > V_2$, an output signal showing that load is not connected correctly is generated.

5. A load connection state detector circuit as claimed in claim 1, wherein said input stage amplification section comprises;

an amplifier circuit including a first transistor having an input signal applied to the base thereof and a second transistor having a reference voltage applied to the base thereof for feeding signals obtained on the collectors of said first and second transistors to later stages;

an offset voltage generation section connected between the bases of said first and second transistors;

an input circuit for applying an input signal to the base of said first transistor;

a control circuit for generating a control signal to perform on/off control of said offset voltage generation section and said input circuit in the opposite direction with respect to each other; and a switch for changing over said control circuit, wherein said amplifier circuit amplifies the input signal applied from said input circuit to produce an amplified output when said switch is in a first state while develops an offset voltage at the output thereof in response to the operation of said offset voltage generation section when said switch is in a second state.

6. An offset voltage generator circuit comprising: an amplifier circuit including a first transistor having an input signal applied to the base thereof and a second transistor having a reference voltage applied to the base thereof for feeding signals obtained on the collectors of said first and second transistors to later stages;
- an offset voltage generation section connected between the bases of said first and second transistors;
- an input circuit for applying an input signal to the base of said first transistor;
- a control circuit for generating a control signal to perform on/off control of said offset voltage generation section and said input circuit in the opposite direction with respect to each other; and
- a switch for changing over said control circuit,
- wherein said amplifier circuit amplifies the input signal applied from said input circuit to produce an amplified output when said switch is in a first state while develops an offset voltage at the output thereof in response to the operation of said offset voltage generation section when said switch is in a second state.

7. An offset voltage generator circuit set forth in claim 6, wherein said input circuit includes a third transistor having an input signal applied to the base thereof, a fourth transistor having a bias signal applied to the base thereof, and an output transistor operable in response to the difference current between the collector currents of said third and fourth transistors, wherein said offset voltage generation section includes an offset transistor and an offset resistor connected in series with said offset transistor, and wherein said offset transistor is turned on, and said third and fourth transistors are turned off in response to the output signal of said control circuit when said switch is in a second state.

8. An offset voltage generator circuit set forth in claim 7, wherein the base of said fourth transistor is connected through a resistor to a fixed potential point of a bias circuit which produces the operating current for said input circuit.

* * * * *